(12) United States Patent
Nozuyama

(10) Patent No.: US 6,766,473 B2
(45) Date of Patent: Jul. 20, 2004

(54) TEST PATTERN SELECTION APPARATUS FOR SELECTING TEST PATTERN FROM A PLURALITY OF CHECK PATTERNS

(75) Inventor: Yasuyuki Nozuyama, Inagi (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 667 days.

(21) Appl. No.: 09/816,214

(22) Filed: Mar. 26, 2001

(65) Prior Publication Data

US 2001/0027539 A1 Oct. 4, 2001

(30) Foreign Application Priority Data

Mar. 27, 2000 (JP) .................................... P2000-087690

(51) Int. Cl.⁷ .............................................. G06F 11/00
(52) U.S. Cl. .......................... 714/33; 714/37; 714/741
(58) Field of Search ........................... 714/26, 25, 32, 714/33, 37, 46, 738, 739, 741; 703/16, 17

(56) References Cited

U.S. PATENT DOCUMENTS

| | | | | |
|---|---|---|---|---|
| 5,719,881 A | * | 2/1998 | Yonetoku | 714/25 |
| 5,771,243 A | * | 6/1998 | Lee et al. | 714/738 |
| 5,844,909 A | * | 12/1998 | Wakui | 714/704 |
| 5,935,264 A | * | 8/1999 | Nevill et al. | 714/724 |
| 6,141,630 A | * | 10/2000 | McNamara et al. | 703/14 |
| 6,151,694 A | * | 11/2000 | Nozuyama | 714/724 |
| 6,567,946 B1 | * | 5/2003 | Nozuyama | 714/741 |
| 6,647,513 B1 | * | 11/2003 | Hekmatpour | 714/37 |
| 6,658,616 B1 | * | 12/2003 | Chang et al. | 714/728 |
| 2001/0010091 A1 | * | 7/2001 | Noy | 716/4 |

FOREIGN PATENT DOCUMENTS

| JP | 9-145800 | | 6/1997 | |
|---|---|---|---|---|
| JP | 11-149491 | * | 2/1999 | G06F/17/50 |

* cited by examiner

Primary Examiner—Scott Baderman
Assistant Examiner—Joshua A Lohn
(74) Attorney, Agent, or Firm—Finnegan, Henderson, Farabow, Garrett & Dunner, L.L.P.

(57) ABSTRACT

In this disclosure, among from verification (test) patterns deselected in conventional test pattern selection processing, one or more verification (test) patterns that can improve a fault coverage are selected, thereby achieving a fault coverage that is substantially identical to a value obtained in all verification (test) patterns by adding an almost minimum set of verification patterns. In this manner, test pattern selection processing with high efficiency can be achieved.

20 Claims, 4 Drawing Sheets

TEST PATTERN SELECTION APPARATUS FOR SELECTING TEST PATTERN FROM A PLURALITY OF CHECK PATTERNS

CROSS REFERENCE TO RELATED APPLICATIONS

The subject application is related to subject matter disclosed in the Japanese Patent Applications No. Tokugan2000-087690 filed in Mar. 27, 2000, to which the subject application claims priority under the Paris Convention and which is incorporated by reference herein.

BACKGROUND OF THE INVENTION

1. Field of the Invention

The present invention relates to a test pattern selection apparatus, method and program for selecting a test pattern based on fault detection information acquired by employing a fault simulation from among a plurality of functional verification patterns relevant to an LSI or a functional block inside the LSI. In particular, the present invention pertains to a technique that makes it possible to achieve a fault coverage (fault detection rate) that is substantially identical to a value that can be expected in all functional verification patterns with functional verification patterns in number substantially fewer than the all functional verification patterns.

2. Description of the Related Art

In general, for each of the chips of manufactured LSIs, a shipment test (quality test) is carried out to check (select only conformance) prior to shipment that such LSIs are not faulty by employing test patterns that conveniently use and edit a plurality of verification patterns used for functional verification during development. In such shipment test, it is required that faults in LSI chips can be detected as reliably as possible by used test patterns. Thus, a fault coverage obtained by fault detection information extracting processing whose main means is fault simulation, a value of which is recognized to have a strong correlation with a product quality from the viewpoints of experience, is employed as a criterion to determine whether or not a test pattern can detect faults reliably. The "fault coverage" used here is a value that indicates how well faults can be detected with test patterns, for example, such as single stuck-at faults assumed in an LSI of a gate level description, in which basic cells composed of combinational logic gates (including primitive elements) and more complicated cells such as flip-flops are connected to each other. Each of the stuck-at faults, assumed 2× number of connection nodes in total in an LSI, is defined for each connection node (wiring) to be fixed to 0 or 1.

In the meantime, although this fault coverage can be directly obtained by fault simulation employing verification patterns, in general, enormous CPU resources are required for fault simulation employing verification patterns. Moreover, in recent years, with advancement of large-scaled and complicated LSIs, the size of verification patterns (number of steps) rapidly increases. Further, it is essential to restrict the size of test patterns that can be stored in an LSI tester in order to carry out a shipment test at a reasonable cost. Thus, it becomes difficult to use such verification pattern intact as test patterns. At the present, it is indispensable to substantially reduce the number of verification patterns used as test patterns.

From such background, conventionally, there has been employed an approach that an LSI developer or function verification engineer selects verification patterns with a possible high fault coverage in consideration of the contents of verification patterns from among all verification patterns; checks the fault coverage for each pattern relevant to faults randomly sampled at a low rate by using such all verification patterns, and selects verification patterns with its high fault detection rate. However, there has been a problem that this approach is poor in efficiency and poor in reliability. In contrast, recently, as an efficient and reliable method, there are commercially available a functional verification coverage evaluation apparatus for analyzing how well verification patterns composed of a number of individual verification patterns achieves functional verification coverages (code coverages) relevant to RTL (Register Transfer Level) description of an LSI or a functional verification pattern selection apparatus for selecting a minimum number of verification pattern sets that achieve the same functional verification coverages as all verification patterns by using the result obtained for each verification pattern. (There are a few items for evaluating quality of functional verification. Consequently a few functional verification coverages are defined.) The result of the selection is used for shipment test pattern selection.

Here, test pattern selection processing employing such functional verification coverage evaluation apparatus and functional verification pattern selection apparatus will be briefly described with reference to FIG. 1.

In conventional test pattern selection processing, when a target LSI or RTL net 50 of a functional block in the LSI and verification patterns (in general, a set of a number of verification patterns) 51 are inputted to a test pattern selection apparatus 40, an RTL code coverage evaluation tool 41 extracts and outputs the functional verification coverages for each verification pattern. Then, a verification pattern selection tool 42 makes selections sequentially from a verification pattern with its high coverage relevant to functional verification items targeted for selection. In addition, this selection tool selects a minimum number of test patterns that achieves functional verification coverages equal to those of all test (verification) patterns. Lastly, when selected verification patterns 52, a net 53 at a gate level that corresponds to an RTL net 50 of the targeted LSI, a library 54 of a basic cell employed in the net 53, and an undetected fault list 55 (in general, automatically prepared by a fault simulator) before fault detection information extraction presumed relevant to the net 53 are inputted to a fault simulator 43, thereby carrying out fault detection information extraction (fault simulation), a fault coverage indicating how well faults can be detected by (a set of) the verification patterns and an (undetected) fault list 56 is outputted. In this case, fault simulation employing individual verification patterns is executed for a (undetected) fault list of the results of fault simulation employing the previous verification patterns. Hereinafter, this simulation is referred to as "incremental" fault simulation (fault detection information extracting processing) distinctly in particular.

According to such test pattern selection processing, in spite of a set of verification patterns that are significantly small as compared with all verification patterns, there can be obtained a fault coverage comparatively close to an expected fault coverage in the case where the full verification patterns are employed. This makes it possible to significantly reduce a CPU time required for extracting fault detection information relevant to an LSI below a gate level or a test pattern length at the time of shipment test.

However, such conventional test pattern selection processing has the following technical problems to be solved.

That is, the functional verification coverages obtained by the conventional test pattern selection processing activates functional verification items at the RTL description level of a targeted LSI in strict senses. The functional verification coverages are good indicators for the coverage of controllability in testability that is s scale indicating how reliably shipment test can be carried out in gate level description. However, the functional verification coverages are not always reliable as to observability. Even although the number of verification patterns can be significantly reduced, in the case where an attempt is made to ensure a fault coverage almost equal to that of all verification patterns, the fault coverage is effective as a first solution, but is somewhat lower (by some percents) than a fault coverage which would be obtained in all verification patterns.

In general, the analysis of undetected faults and preparation of additional verification patterns are difficult works requiring many engineer resources. Thus, the slight lowering of fault coverage is a very big problem. Therefore, it is expected to introduce a test pattern selection technique with its high efficiency capable of reliably achieving a fault coverage that is substantially identical to that of all test (verification) patterns with a small number of test patterns.

SUMMARY OF THE INVENTION

The present invention has been made in order to solve the foregoing technical problems. It is an object of the present invention to provide a computer readable recording medium storing a test pattern selection apparatus, method and program with its significantly high efficiency as compared with conventional apparatus, methods and programs.

According to a first aspect of the present invention, there is provided a test pattern selection apparatus comprising: a fault detection information extracting portion for employing selected test patterns from a set of test patterns discriminated to be selected or deselected in advance to execute incremental fault simulation, and employing an arbitrary deselected test pattern to execute fault simulation, and then, extract a fault coverage and a detected and undetected fault list; a random sampling processing portion for randomly sampling some of the faults in an undetected fault list; and a selecting portion for selecting test patterns that greatly contributes to improvement of a fault coverage in the deselected test patterns by referring to the detected and undetected fault list.

In this manner, a fault coverage almost equal to a value obtained with all verification patterns can be achieved with verification patterns (test patterns) significantly fewer than all verification patterns.

According to a second aspect of the present invention, there is provided a test pattern selection method comprising: a first test pattern selection step of selecting test patterns; a first fault detection information extracting step of employing the thus selected test patterns, thereby executing incremental fault simulation, and extracting a first undetected fault list; a random sampling processing step of randomly sampling some of undetected faults in the first undetected fault list to generate a second undetected fault list; a second fault detection information extracting step of employing the second undetected fault list and a deselected arbitrary test pattern in the first test pattern selection step, thereby executing fault simulation, and generating a detected and undetected fault list for each of the deselected test patterns; and a second test pattern selection step of selecting test patterns that greatly contributes to improvement of a fault coverage from among the deselected test patterns by referring to the detected and undetected fault list for each test pattern deselected.

In this manner, a fault coverage almost equal to a value obtained with all verification patterns can be achieved with verification patterns (test patterns) significantly fewer than all verification patterns.

According to a third aspect of the present invention, there is provided a test pattern selection program comprising: a first test pattern selection process of selecting test patterns; a first fault detection information extracting process of employing the thus selected test patterns, thereby executing incremental fault simulation, and extracting a first undetected fault list; a random sampling processing process of randomly sampling some of undetected faults in the first undetected fault list to generate a second undetected fault list; a second fault detection information extracting process of employing the second undetected fault list and a deselected arbitrary test pattern in the first test pattern selection step, thereby executing fault simulation, and generating a detected and undetected fault list for each of the deselected test patterns; and a second test pattern selection process of selecting test patterns that greatly contributes to improvement of a fault coverage from among the deselected test patterns by referring to the detected and undetected fault list for each test pattern deselected, the test pattern selection program causing a computer to execute these processes.

However, with respect to functional verification coverage evaluation process, first verification pattern selection processing, random sampling processing or fault detection information extracting processing, essentials of the processes in line with their respective purposes are stored as another program in another computer readable recording medium. A test pattern selection program may be responsible for execution and control of these processes (such as input and/or output of required data, each program startup).

In this manner, a fault coverage almost equal to a value obtained by all test patterns (verification patterns) can be achieved in test patterns significantly fewer than all test patterns.

In addition, an undetected fault list targeted for executing the incremental fault simulation may not always be all of the targeted LSIs, and may be part thereof. In particular, there may be described faults that cannot be detected and remain undetected using a testing approach other than that employing functional verification patterns and a fault simulation such as a scan test technique applied to a targeted LSI, thereby executing ATPG (Automatic Test Pattern Generation).

Further, functional verification coverage evaluation processing and first test pattern selection processing, as in a conventional manner, can be substituted by a method for manually selecting test patterns that may greatly contribute to improvement of a fault coverage by proper means. In this case, although it is not efficient, in the case where a fault coverage is too low in view of processing capability of a test pattern selection apparatus by referring to the results of the first fault detection information extracting, it may be required to further add test patterns, and improve the fault coverage, and then, perform the processing of random sampling and subsequent processes.

In addition, second test pattern selection processing desirably comprises: an additional detection fault number extracting process for computing the number of additional detection faults indicating how many undetected faults are detected in a reference undetected fault list by referring to the detected and undetected fault list for each test pattern deselected in a first test pattern selection process; an evaluation value computation process for computing an evaluation value for each test pattern deselected in the first test pattern selection process by a predetermined evaluation formula where the number of additional detection faults and a test pattern length are defined as inputs; and a selection process for selecting test patterns that greatly contribute to improvement of a fault coverage in the deselected test patterns in accordance with the computed evaluation value.

In addition, incremental fault simulation (fault detection information extracting processing) may be executed for final check by employing test patterns that greatly contribute to improvement of a fault coverage and a first undetected fault list.

With this additional process, with respect to undetected faults that has not been evaluated by random sampling processing as well, detected and undetected faults are clarified by the best patterns. Thus, the analysis of undetected faults of the targeted LSI and the generation of additional test patterns can be facilitated.

Further, in first fault detection information processing, a test pattern that does not meet a predetermined improvement value of fault coverage in test patterns selected by test pattern selection processing is added to test patterns (verification patterns) deselected by a test pattern selecting portion, whereby faults detected by the test pattern that does not meet the predetermined improvement value of fault coverage may be returned in an undetected fault list. Alternatively, with respect to such undetected fault list, in the case where the improvement of a predetermined fault coverage value is not found as a result of incremental fault simulation employing a certain test pattern, incremental fault simulation may be performed by employing an undetected fault list as a result of execution in a test pattern immediately preceding that test pattern together with the next test pattern (verification pattern).

With this construction, even if contribution to improvement of the functional verification coverages is found at a level of RTL, there occurs a possibility that test patterns with small contribution to improvement of a fault coverage is deselected at a gate level. Thus, a fault coverage almost equal to that of all test patterns can be obtained in smaller test pattern size.

Furthermore, in second test pattern selection processing, a plurality of test patterns may be selected at one processing operation.

With this construction, although there is a disadvantage that a slightly increased number of test patterns must be selected, the number of executions of additional detection fault number computation processing with a large amount of computations can be significantly reduced, thus enabling test pattern selection that more efficiently achieves a fault coverage almost equal to that of all test patterns.

Other and further objects and features of the present invention will become obvious upon understanding of the illustrative embodiments about to be described in connection with the accompanying drawings or will be indicated in the appended claims, and various advantages not referred to herein will occur to one skilled in the art upon employing of the invention in practice.

DETAILED DESCRIPTION OF THE PREFERRED EMBODIMENTS

Figure 1:
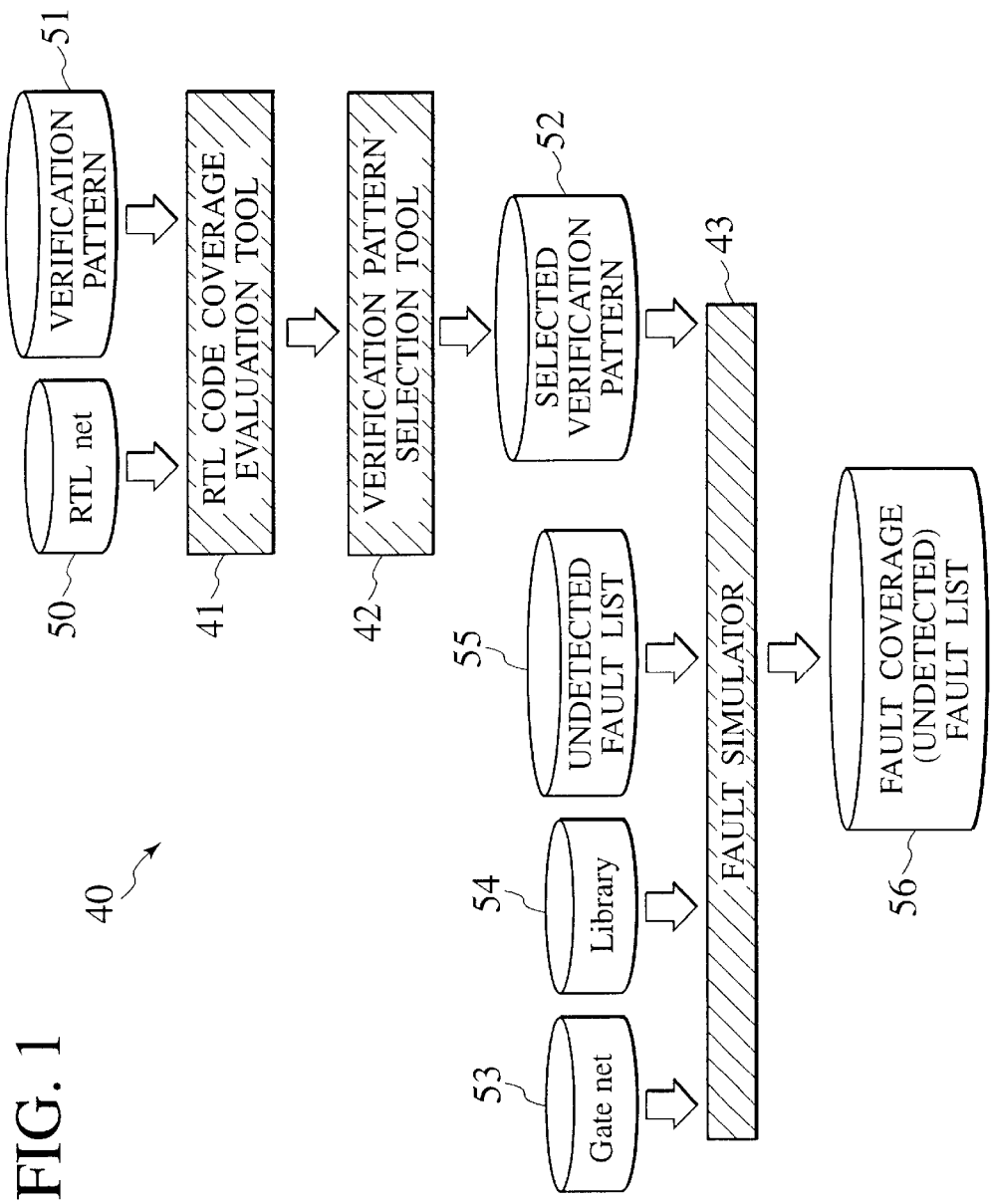
FIG. 1 is a schematic view illustrating conventional test pattern selection processing.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Hereinafter, a test pattern selection apparatus, method and program for selecting test patterns according to embodiments of the present invention will be described in detail with reference to FIG. 2 to FIG. 4. In the following description, verification patterns are referred to as test patterns in a sense in which the verification patterns are employed for a product quality test.

Test Pattern Selection Apparatus

FIG. 1 is a block diagram depicting a construction of a test pattern selection apparatus according to one embodiment of the present invention.

Figure 2:
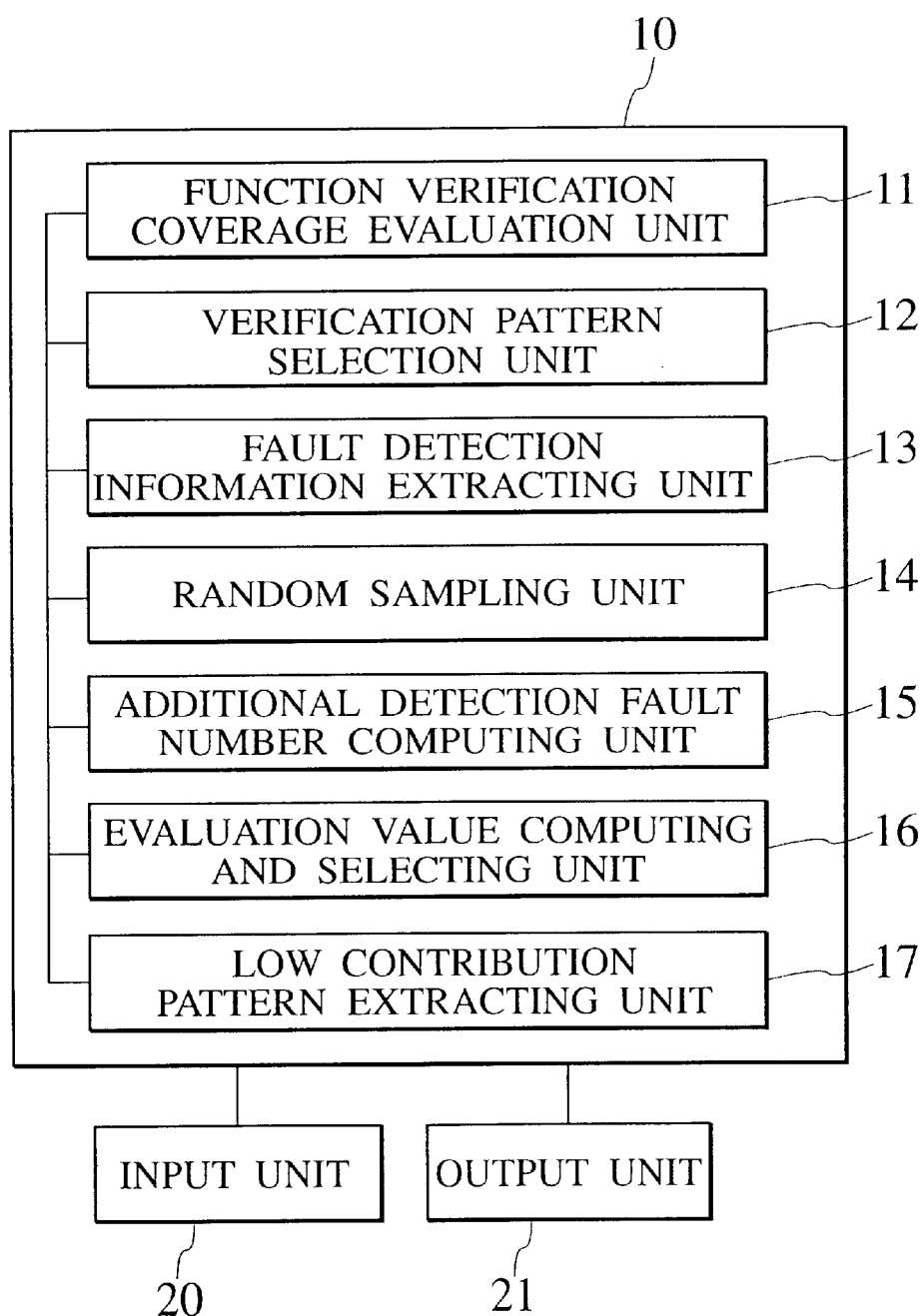
FIG. 2 is a block diagram showing a construction of a test pattern selection apparatus according to one embodiment of the present invention.

A test pattern selection apparatus 10 according to one embodiment of the present invention, as shown in FIG. 2, comprises a functional verification coverage evaluation portion 11 for extracting functional verification coverages of each test pattern; a verification pattern selecting portion 12 for employing functional verification coverage information extracted by the functional verification coverage evaluation portion 11 and a functional verification items (described later) targeted for selection, thereby selecting a minimum number of test patterns that achieves functional verification coverages identical to a case in which all test patterns are employed; a fault detection information extracting portion 13 for employing a test pattern, thereby executing incremental fault simulation (fault detection information extraction) or mere fault simulation, and outputting a fault coverage and an undetected fault list; a random sampling portion 14 for randomly sampling some undetected faults from among an undetected fault list obtained as a result of fault simulation to generate a new undetected fault list; an additional detection fault number computing portion 15 for employing all test patterns deselected from the verification pattern selecting portion 12, thereby executing fault simulation at the fault detection information extracting portion 13, and storing an outputted undetected fault list for each of the deselected test patterns, thereby computing the number of additional detection faults for each of the deselected test patterns; and an evaluation value computing and selecting portion 16 for computing an evaluation value of each verification pattern (test pattern) deselected in accordance with a predetermined evaluation formula where the number of additional detection faults and a verification pattern (test pattern) length are defined as inputs, and selecting test patterns that greatly contribute to improvement of a fault coverage from among the deselected test patterns.

Further, a test pattern selection apparatus 10 is connected to an input portion 20 for inputting a variety of control information related to the apparatus 10 or a variety of information required for test pattern selection relevant to a targeted LSI; and an output portion 21 for outputting information such as selection result of the apparatus 10 or error information. As the input portion 20, there may be employed a keyboard, a mouse pointer and a light pen or the like. In addition, as the output portion 21, there may be employed a printer or display device and the like.

Test Pattern Selection Method

Figure 3:
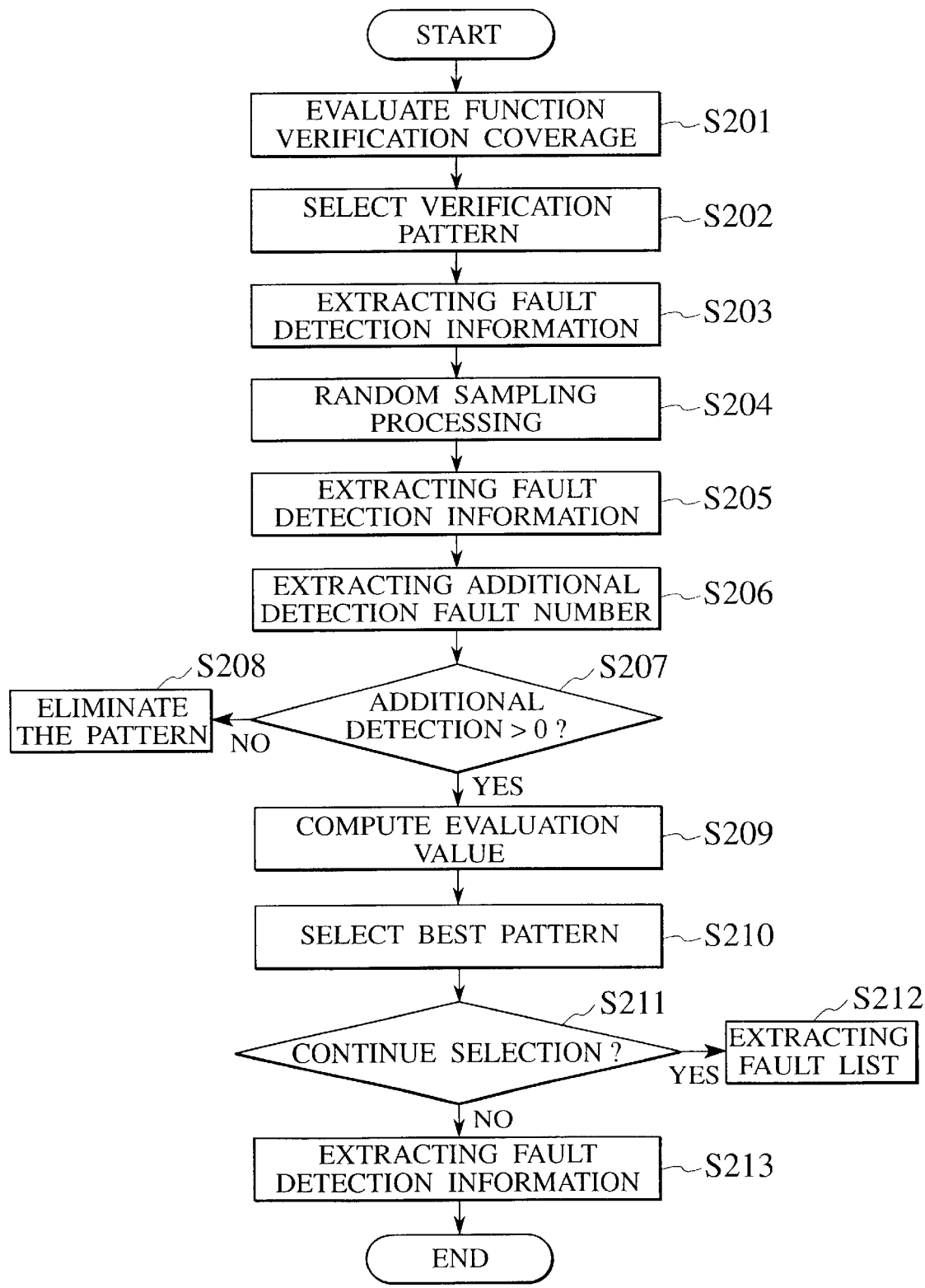
FIG. 3 is a flow chart showing a test pattern selection method according to one embodiment of the present invention.

FIG. 3 is a flow chart showing a test pattern selection method according to one embodiment of the present invention.

The test pattern selection method according to one embodiment of the present invention executes the following steps.

(1) A functional verification coverage evaluation portion 11 extracts functional verification coverages for each test pattern in a set by employing targeted LSI or an RTL net of functional blocks inside of the LSI and a set of test patterns (functional verification coverage evaluation step S201).

(2) A verification pattern selecting portion 12 selects a minimum number of test patterns that achieve functional verification coverages identical to a case in which all test patterns are employed from among a set of test patterns by employing functional verification coverage information and functional verification items targeted for selection (verification pattern selection step S202).

Here, the "functional verification items" used here, existing in RTL description that describes an LSI or functional operations in the LSI, for each of which a coverage is defined, include: a statement coverage indicating a rate at which an executable statement has been executed; a branch coverage indicating a rate at which truth or falseness of branch has been executed; a condition coverage indicating how well a logical formula of branch conditions is activated; and a toggle coverage indicating how many wires on RTL description are set to 0 or 1.

(3) A fault detection information extracting portion 13 outputs a fault coverage and an undetected fault list by executing incremental fault simulation by employing a selected test pattern; a net at a gate level that corresponds to the RTL net of the targeted LSI; a library of a basic cell employed in the gate level net; and an undetected fault list (in general, automatically generated by a fault simulator) before implementing incremental fault simulation assumed relevant to the gate level net (fault detection information sampling step S203).

Here, the undetected fault list used here includes: an undetected fault, a fault reliably detected as a result of fault simulation; a potentially detected fault in which, for example, although 0 or 1 is fixedly outputted in a normal case, an indefinite value "x" is set as a result of a presence of such fault or a hyperactive fault in which computation is interrupted because there is apprehension that a meaningless increase of the CPU time is caused by fault analysis in a specific test pattern; or a redundant fault. In the test pattern selection apparatus and method according to the present invention, the "undetected faults" in the fault list obtained in this portion 13 is important. Basically, the above list includes only complete undetected faults (and hyperactive faults), but may include potentially detected faults. With respect to the potentially detected fault, in the case where the number of potential detection of a fault exceeds a predetermined limit, it may be classified as a probably detected fault which is regarded as having been almost reliably detected. Such probably detected fault may be handled as a detected fault, and such potentially detected fault may be handled as an undetected fault.

(4) A random sampling portion 14 randomly samples undetected faults in an undetected fault list outputted by a fault detection information extracting portion 13, and generates a new undetected fault list (random sampling processing step S204).

Here, random sampling processing is intended to reduce a CPU time required for executing fault detection information extracting processing (fault simulation). In general, although the execution time of fault detection information extracting processing is substantially proportional to a random sampling rate, if the random sampling rate is lowered, the reliability of the result of fault detection information extracting is lowered. However, in a test pattern selection apparatus and method therefore according to the present invention, fault detection extracting is executed by employing a test pattern set selected by employing the verification pattern selecting portion 12, the fault coverage of which is substantially close to that caused by all test patterns. Thus, even if the random sampling rate is lowered to a certain extent, there can be reduced apprehension that large deviation occurs with the result of the fault coverage.

(5) A fault detection information extracting portion 13 executes fault simulation, and generates a fault list for each of all the test patterns (including detected and undetected faults) by employing an undetected fault list generated by a random sampling portion 14, a gate level net of the targeted LSI, a library that such net uses, and an arbitrary test pattern deselected by the verification pattern selecting portion 12 (fault detection information extracting step S205).

(6) An additional detection fault number computing portion 15 comparatively compute how well undetected faults have been detected in an undetected fault list by using information on each of the deselected test patterns and/or a fault list for each test pattern (additional detection fault number extracting step S206).

Here, when the additional detection fault number extracting step is first executed, the undetected fault list is the same as that sampled by the random sampling portion 14, additionally detected faults of each test pattern are the same as those obtained in the step S205.

(7) As a result of comparative computation, it is judged whether or not there is present a test pattern in which the number of additional detection faults is 0 (additional detection fault number judgment step S207); a test pattern in which the additional detection fault number is 0 is removed from the subsequent processing (pattern removal processing step S208); and the subsequent processing (evaluation value computing step S209) is executed when the number of additional detection faults is 1 or more. Further, the step (7) can be executed in batch in the step (8).

(8) An evaluation value computing and selecting portion 16 computes the evaluation value of each test pattern in accordance with the following predetermined evaluation formula by referring to the additional detection fault number for each test pattern and selection information (evaluation value computing step S209), and selects a test pattern with the maximum evaluation value as a best pattern (best pattern selection step S210).

The "evaluation formula" used here is shown below, where the number of additional detection faults and test parameters are defined as variables.

Evaluation Formula r×(the additional fault detection number)+(1−r)/(test pattern length (the number of steps))

Here, the "r" is a parameter for adjusting the additional detection fault number and weighting of test pattern size, the parameter being set within the range of 0 <r<1. If a value of "r" is large, although a test pattern with a large number of additional detection faults is selected, there is high possibility that a long test pattern is selected. On the other hand, if the value of "r" is reduced, although a test pattern with its short pattern length is preferentially selected, the number of faults subjected to additional detection does not increase speedily as compared with the number of selected test patterns. Thus, it is required to execute a large number of additional detection fault number computation processing with a large amount of computation until a predetermined fault coverage has been obtained. Thus, there occurs a disadvantage that the CPU time increases. Therefore, during actual processing, it is required for a user to set a proper value in selection information.

Further, the "selection information" used here denotes information required for selection processing set by the user side such as "r" value, or what evaluation value of test pattern(s) or what number of test patterns with highest evaluation value is selected as the best pattern (s).

In addition, in the above evaluation formula, instead of the additional detection fault number, there can be employed "normalized" additional detection fault number obtained by dividing the additional detection fault number by the maximum additional detection fault number obtained at the additional detection fault number extracting step. Further, instead of a test pattern length, there can be employed a "normalized" test pattern length obtained by dividing the test pattern length by the maximum test pattern length in the test pattern targeted for the evaluation value of (9). By doing this, there is an advantage that "r" can be employed in general sense, and feasibility is improved.

(9) It is judged whether or not best pattern selection processing is continued (selection continuation judgement step S211). When selection processing is continued, it goes to the fault list extracting step (S212). Otherwise, it goes to fault detection information extracting step (S213).

(10) An evaluation value computing and selecting portion 16 compares the undetected fault list with that (those) of the best pattern fault lists; checks detected and undetected faults against the undetected fault list, and stores them in detected and undetected fault lists as a report on best pattern(s) (fault list extracting step S212). This step can be achieved in the form that, as long as a computer system has sufficient memory space, a fault list secondarily obtained at the additional detection fault number computing step is temporarily stored in such memory, and the faults corresponding to the best patterns are merely selected. In this manner, there can be obtained a set of test patterns other than test patterns in which the additional detection fault number are 0 and the best pattern(s) and a new undetected fault list. Next, these undetected fault list and test patterns are subjected to the additional detection fault number extracting step S206 again.

(11) A fault detection information extracting portion 13 executes incremental fault simulation processing by employing the best patterns for the undetected fault list generated at the fault detection information extracting step S203 (fault detection information extracting step S213). Although this step (fault detection information extracting step S213) may be omitted, according to this processing step, undetected faults that have not been evaluated by random sampling processing can be also clarified to be detected or undetected by the best pattern. Thus, the analysis of undetected faults of the targeted LSI and the generation of additional test patterns can be facilitated.

In this manner, in the test pattern selection apparatus and method therefore according to embodiments of the present invention, a test pattern that greatly contributes to improvement of a fault coverage is efficiently selected; and finally, a fault coverage almost equal to that caused by all verification patterns can be achieved in test patterns total size of which is substantially smaller than that deselected at the verification pattern selecting portion 12.

In the test pattern selection method according to the embodiment of the present invention, a condition required from the start to the end of pattern selection may be preset. At this time, in all test patterns, when the additional detection fault number is 0, processing, of course, terminates. However, there is a possibility that a considerably large number of test patterns are selected until such processing has terminated. Thus, for example, it is desirable that processing is terminated in the case where summation of the additional detection fault counts in all test patterns targeted for selection can only improve the fault coverage to a value less than a predetermined value (for example, 0.1%).

In addition, in the test pattern selection method according to the embodiment of the present invention, fault list extracting processing and additional detection fault number extracting processing are clarified for the purpose of convenience. The contents of these processes are analogous to each other. Thus, during computation of the additional detection fault number, extracting of detected faults caused by each test pattern, i.e., extracting processing of faults to be excluded from the undetected fault list may be performed in parallel. In addition, every time a test pattern with its additional detection fault number larger than the already obtained additional detection fault number is detected, such test pattern may be overwritten in an undetected or detected fault list or all or a majority of the result of such detection may be temporarily stored in a computer system memory, as described previously.

APPLICATION EXAMPLE 1

In general, when incremental fault detection information extracting is carried out by employing some test pattern selected by a verification pattern selecting portion 12, it is found that contribution to improvement of a fault coverage of a targeted LSI is relatively small. Then, as application example 1 of the test pattern selection apparatus and method therefore according to one embodiment of the present invention, there is preferably provided a low contribution pattern extracting portion 17 in which a predetermined fault detection improvement rate is preset (for example 0.01% to 0.02%); a test pattern that does not meet the set improvement rate is recorded in a low contribution test pattern list; faults additionally detected by such a test pattern are treated as those detected in a low contribution test pattern; that is, in a fault list used in the next test pattern these faults are processed to be an undetected fault. In this application example 1, a low contribution test pattern list is added to that of deselected test patterns, and substantially, similar processing is applied.

With respect to handling of an undetected fault list concerning a low contribution pattern, as described above, an undetected fault list produced as an execution result of incremental fault simulation done just before that employing the low contribution test pattern may be employed for incremental fault simulation in the next test pattern.

According to this application example 1, even if contribution to improvement of functional verification coverages is found at a level of RTL, there is a possibility that contribution to improvement of a fault detection rate is deleted at a gate level. Thus, a fault detection rate almost equal to that of all test patterns can be obtained in smaller test pattern size.

APPLICATION EXAMPLE 2

The test pattern selection apparatus and method therefore according to the embodiment of the present invention are constructed to select a best pattern in one procedure sequence. As an application example, test patterns that meet the following formula are handled as a group of best test patterns, and these test patterns are continuously inputted to the fault list extracting processing step so that an undetected fault list containing these test patterns may be generated.
(Formula) Evaluation value $\geq$ a (maximum evaluation value–possible lowest evaluation value (0)) (0<a<1)

In this process, in the case where there exists a test pattern whose additional detection fault number is 0, of course, such pattern can be removed from the best test pattern group. Further, as a result of consecutive execution, a test pattern in which the evaluation value is equal to or smaller than the best value by a certain rate may be removed.

According to this application example 2, although a slightly increased number of test patterns may be selected, the execution count of additional detection fault number computation processing with a large number of computation can be significantly reduced. Thus, a fault coverage almost equal to all verification patterns is achieved more efficiently, thus enabling test pattern selection processing with higher efficiency.

Figure 4:
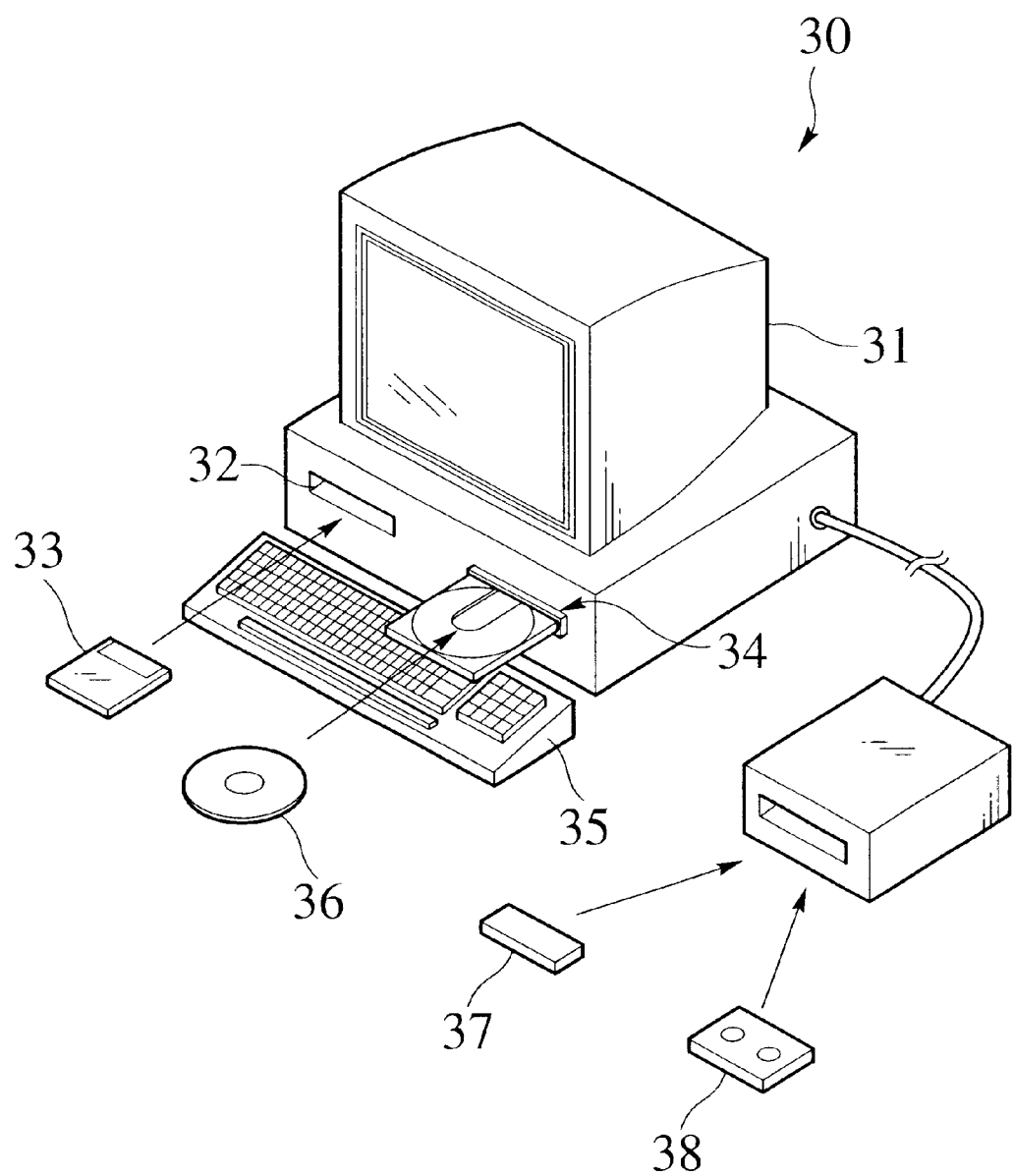
FIG. 4 is an external view showing a configuration of the test pattern selection apparatus according to one embodiment of the present invention.

Further, the test pattern selection apparatus according to the embodiment of the present invention, for example, has an outline construction shown in FIG. 4. Namely, the test pattern selection apparatus according to the embodiment of the present invention is constructed by incorporating elements of the test pattern selection apparatus in a computer system 30. This computer system 30 comprises a floppy disk drive 32 and an optical disk drive 34. A floppy disk 33 is inserted into a floppy disk drive 32, an optical disk 36 is inserted into an optical disk drive 34, and predetermined readout operation is performed, whereby test pattern selection programs stored in these recording media can be installed in a system. In addition, by connecting a predetermined drive unit, for example, installation or data reading and writing can be executed by employing a ROM 37 serving as a memory device or a cartridge 38 serving as a magnetic tape device. Further, a user can input various types of data according to test pattern selection processing via a keyboard 35, and can know a variety of computation results or the like via a display 31. It is also possible that the test pattern selection apparatus is read into computer system 30 via a network connection.

In addition, the test pattern selection method according to the embodiment of the present invention may be programmed and stored in a computer readable recording medium. In performing test pattern selection, this recording medium is read by a computer system; a program is stored in a storage portion such as memory in the computer system; and a test pattern selection is executed by a computing unit, whereby the test pattern selection method of the present invention can be provided. Here, the recording medium used here includes, for example, computer readable media such as a semiconductor memory, a magnetic disk, an optical disk, a magneto-optical disk or a magnetic tape. In this case, as described above, a functional verification coverage evaluation program, a verification pattern selection program, or a fault simulation program may be read in the computer system by mans of another storage medium.

As has been described above, it should be fully understood that the present invention encompasses a variety of embodiments that have not been described therein. Therefore, the present invention must be limited by specific matters of the invention according to reasonable claims from the disclosure.

What is claimed is:

1. A test pattern selection apparatus for selecting test patterns based on fault detection information obtained by employing a fault simulation from among a plurality of verification patterns relevant to an LSI or functional blocks inside the LSI, comprising:

a fault detection information extracting portion for employing selected test patterns from a set of test patterns discriminated to be selected or deselected in advance to execute incremental fault simulation and extract a first undetected fault list, and employing any one of deselected test pattern to execute fault simulation, and then, extract a fault coverage and a detected and undetected fault list;

a random sampling processing portion for randomly sampling some of the faults in the first undetected fault list; and a selecting portion for selecting test patterns that greatly contribute to improvement of a fault coverage in the deselected test patterns by referring to the detected and undetected fault lists.

2. The test pattern selection apparatus according to claim 1, further comprising:

a functional verification coverage evaluation portion for extracting functional verification coverages for each test pattern; and a test pattern selecting portion for selecting test patterns with its high functional verification coverages from among a plurality of test patterns by referring to extracted functional verification coverages, and selecting a minimum number of test patterns that achieve functional verification coverages equal to those of all test patterns, wherein a set of test patterns are discriminated to be selected or deselected by employing the functional verification coverage evaluation portion and test pattern selecting portion.

3. The test pattern selection apparatus according to claim 1, wherein said selecting portion comprising:

an additional detection fault number sampling portion for computing an additional detection fault count indicating how many undetected faults are detected by each of said deselected test pattern; and an evaluation value computing and selecting portion for computing an evaluation value of each deselected test pattern in accordance with a predetermined evaluation formula where said additional detection fault number and a test pattern step number (size) are defined as inputs, and selecting test patterns that greatly contribute to improvement of a fault coverage in the deselected test patterns.

4. The test pattern selection apparatus according to claim 1, further comprising:
   a low contribution pattern extracting portion for adding test patterns that do not meet a predetermined improvement rate of fault detection in said selected test patterns to said deselected test (verification) patterns, and returning an additionally detected faults by each of the test patterns that does not meet the predetermined improvement rate of fault detection into an undetected fault list.

5. The test pattern selection apparatus according to claim 3, wherein said evaluation value computing and selecting portion selects test patterns that greatly contribute to improvement of a fault coverage at one processing operation.

6. The test pattern selection apparatus according to claim 4, wherein an undetected fault list as a result of incremental fault simulation employing a test pattern immediately preceding a test pattern with its low contribution to improvement of a fault coverage is employed as an undetected fault list employed for incremental fault simulation together with a test pattern to be executed after the test pattern with its low contribution to said improvement in fault detection.

7. A test pattern selection method for selecting test patterns based on fault detection information obtained by employing fault simulation from among a plurality of test (verification) patterns relevant to an LSI or a functional block inside the LSI, said test pattern selection method comprising the steps of:
   a first test pattern selecting step of selecting test patterns;
   a first fault detection information extracting step of executing an incremental fault simulation by employing the selected test patterns, thereby extracting a first undetected fault list;
   a random sampling processing step of randomly sampling some of the undetected faults in said undetected fault list to generate a second undetected list;
   a second fault detection information extracting step of executing a fault simulation by employing an arbitrary one of deselected test patterns at the first test pattern selection step and the second undetected fault list to generate a detected and undetected fault list for each deselected test pattern; and
   a second test pattern selection step of selecting test patterns that greatly contribute to improvement of a fault coverage in the deselected test patterns by referring to said second undetected fault list and the detected and undetected fault list for each test pattern.

8. The test pattern selection method according to claim 7, wherein said first test pattern selection step comprises the steps of:
   a functional verification coverage evaluation step of extracting functional verification coverages for each test pattern; and
   a selection step of selecting test patterns with its high functional verification coverages from among a plurality of test patterns by referring to the extracted functional verification coverages, thereby selecting a minimum number of test patterns that achieves functional verification coverage equal to all test patterns.

9. The test pattern selection method according to claim 7, wherein said second test pattern selection step comprises the steps of:
   an additional detection fault number extracting step of referring to the detected and undetected fault list for each test pattern, thereby computing an additional detection fault number indicating how many undetected faults have been detected in a reference undetected fault list by referring to the detected and undetected fault list for each test pattern deselected at the first test pattern selection step;
   an evaluation value computing step of computing the evaluation value of each test pattern deselected at the first test pattern selection step in accordance with a predetermined evaluation formula when said additional detection fault number and test pattern length are defined as inputs; and
   a selection step of selecting test patterns that greatly contribute to improvement of a fault coverage in the deselected test patterns in accordance with the computed evaluation value.

10. The test pattern selection method according to claim 7, further comprising the step of:
    a third fault detection information sampling step of executing an incremental fault simulation by employing test patterns that greatly contribute to improvement of said fault coverage and a first undetected fault list.

11. The test pattern selection method according to claim 7, further comprising the step of:
    a low contribution pattern extracting step of adding test patterns that do not meet a predetermined improvement rate of fault detection in test patterns selected in accordance with said first test pattern selection step, and returning additionally detected faults into an undetected fault list according to test patterns that do not meet an improvement rate of a desired fault detection.

12. The test pattern selection method according to claim 11, wherein an undetected fault list of the result of an incremental fault simulation employing a test pattern immediately preceding a test pattern in which improvement of a predetermined detection rate is not found is employed as an undetected fault list employed for an incremental fault simulation together with a test pattern executed after the test pattern in which said predetermined fault coverage is not found.

13. The test pattern selection method according to claim 7, wherein a plurality of test patterns are selected at one process at said second test pattern selection step.

14. A test pattern selection program product for selecting test patterns based on fault detection information obtained by employing fault simulation from among a plurality of test (verification) patterns relevant to an LSI or a functional block inside the LSI, said test pattern program product comprising:
    a computer readable program code for selecting test patterns;
    a computer readable program code for executing an incremental fault simulation by employing test patterns selected, thereby extracting a first undetected fault list;
    a computer readable program code for randomly sampling some of the undetected faults in said first undetected fault list for a computer readable program code to generate a second undetected fault list;
    a computer readable program code for executing a fault simulation by employing a second undetected fault list and an arbitrary test pattern deselected at a first test pattern selection step, thereby generating a detected and undetected fault list for each deselected test pattern; and a computer readable program code for referring to each said detected and undetected fault list for each test pattern deselected and said second undetected fault list, thereby selecting test patterns that greatly contribute to improvement of a fault coverage from among the deselected test patterns.

15. The test pattern program product according to claim 14, wherein the computer readable program code for selecting a test pattern comprises:

a computer readable program code for extracting a functional verification coverage for each test pattern; and a computer readable program code for referring to extracted functional verification coverages, thereby selecting test patterns with high functional verification coverages from among a plurality of test patterns, and selecting a minimum number of test patterns that achieves functional verification coverages equal to all test patterns.

16. The test pattern selection program product according to claim 14, wherein the computer readable program code for referring to a detected and undetected fault list for each test pattern deselected and said second undetected fault list, thereby selecting test patterns that greatly contribute to improvement of a fault coverage from among deselected test patterns comprises:

a computer readable program code for referring a detected and undetected fault list for each test pattern deselected and a reference undetected fault list, thereby computing an additional detection fault number indicating how many undetected faults have been detected in the reference undetected fault list;

a computer readable program code for computing the evaluation value of each test pattern deselected in accordance with a predetermined evaluation formula when said additional detection fault number and a test pattern length are defined as inputs; and a computer readable program code for selecting test patterns that greatly contribute to improvement of a fault coverage from among the deselected test patterns in accordance with the computed evaluation value.

17. The test pattern selection program product according to claim 14, further comprising a computer program code for employing test patterns that greatly contribute to improvement of said fault coverage and a first undetected fault list, thereby executing an incremental fault simulation.

18. The test pattern selection program product according to claim 14, further comprising a computer program code for adding test patterns that do not meet a predetermined improvement rate of fault detection to test patterns deselected by said first test pattern selection processing in test patterns selected by said first test pattern selection processing, thereby returning the faults additionally detected by each of the test patterns that does not meet a predetermined improvement rate of fault detection into an undetected fault list.

19. The test pattern selection program product according to claim 18, wherein an undetected fault list of the result of an incremental fault simulation employing a test pattern immediately preceding a test pattern in which a predetermined improvement of a fault coverage is not found is employed as an undetected fault list employed for an incremental fault simulation together with a test pattern executed after a test pattern in which said predetermined improvement of a fault coverage is not found.

20. The test pattern selection program product according to claim 14, wherein, when test patterns that greatly contribute to improvement of a fault coverage are selected in deselected test patterns by referring to a detected and undetected fault list of each test pattern deselected and said second undetected fault list, a plurality of test patterns are selected at one process.

* * * * *